(12) United States Patent
Xiao

(10) Patent No.: US 10,516,058 B2
(45) Date of Patent: Dec. 24, 2019

(54) LOW TEMPERATURE POLYSILICON THIN FILM TRANSISTOR AND PREPARATION METHOD THEREOF

(71) Applicant: WUHAN CHINA STAR OPTOELECTRONICS TECHNOLOGY CO., LTD., Wuhan, Hubei (CN)

(72) Inventor: Donghui Xiao, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 127 days.

(21) Appl. No.: 15/575,107

(22) PCT Filed: Aug. 21, 2017

(86) PCT No.: PCT/CN2017/098337
§ 371 (c)(1),
(2) Date: Nov. 17, 2017

(87) PCT Pub. No.: WO2019/028934
PCT Pub. Date: Feb. 14, 2019

(65) Prior Publication Data
US 2019/0221672 A1    Jul. 18, 2019

(30) Foreign Application Priority Data

Aug. 7, 2017  (CN) .......................... 2017 1 0668038

(51) Int. Cl.
*H01L 29/78* (2006.01)
*H01L 21/02* (2006.01)
(Continued)

(52) U.S. Cl.
CPC .. *H01L 29/78633* (2013.01); *H01L 21/02532* (2013.01); *H01L 21/02675* (2013.01);
(Continued)

(58) Field of Classification Search
CPC ......... H01L 21/02532; H01L 21/02675; H01L 21/26506; H01L 21/28167;
(Continued)

(56) References Cited

U.S. PATENT DOCUMENTS 5,470,762 A * 11/1995 Codama ................. H01L 27/12
257/E21.413
5,728,610 A  3/1998 Gosain et al.
(Continued)

FOREIGN PATENT DOCUMENTS

CN          1434485 A      8/2003
CN       104091832 A     10/2014
(Continued)

*Primary Examiner* — Matthew L Reames
(74) *Attorney, Agent, or Firm* — Mintz Levin Cohn Ferris Glovsky and Popeo, P.C.; Jhongwoo Peck

(57) ABSTRACT

The present invention discloses a preparation method of a low temperature polysilicon thin film transistor including: successively forming a polysilicon active layer and a gate insulating layer covering the active layer on a base substrate; implanting nitrogen ions on a surface of the polysilicon active layer facing the gate insulating layer by an ion implantation process to form an ion implantation layer; and recrystallizing the ion implantation layer by a high temperature annealing process to form a silicon nitride spacing layer between the polysilicon active layer and the gate insulating layer. The present invention also provides a low temperature polysilicon thin film transistor including a polysilicon active layer, a gate insulating layer, a gate electrode, a source electrode and a drain electrode successively provided on a base substrate, wherein a connection interface between the polysilicon active layer and the gate insulating layer is (Continued)

formed with a silicon nitride spacing layer, and the silicon nitride spacing layer and the polysilicon active layer are in a integrally interconnected structure.

14 Claims, 11 Drawing Sheets

(51) Int. Cl.
    *H01L 29/786*     (2006.01)
    *H01L 29/51*     (2006.01)
    *H01L 29/66*     (2006.01)
    *H01L 21/28*     (2006.01)
    *H01L 21/265*     (2006.01)

(52) U.S. Cl.
    CPC .. *H01L 21/26506* (2013.01); *H01L 21/28167* (2013.01); *H01L 29/511* (2013.01); *H01L 29/518* (2013.01); *H01L 29/66757* (2013.01); *H01L 29/78621* (2013.01)

(58) Field of Classification Search
    CPC ............. H01L 29/78633; H01L 29/511; H01L 29/518; H01L 29/66757; H01L 29/78621
    See application file for complete search history.

(56) References Cited

U.S. PATENT DOCUMENTS

| | | | | |
|---|---|---|---|---|
| 6,037,639 | A * | 3/2000 | Ahmad | ............ H01L 21/26506 257/401 |
| 6,569,781 | B1 * | 5/2003 | Dokumaci | ........ H01L 21/26506 438/775 |
| 2002/0042168 | A1 | 4/2002 | Yi et al. | |
| 2007/0114605 | A1 * | 5/2007 | Dyer | ................. H01L 21/26506 257/336 |

FOREIGN PATENT DOCUMENTS

| | | |
|---|---|---|
| CN | 104218090 A | 12/2014 |
| CN | 106847703 A | 6/2017 |

* cited by examiner

LOW TEMPERATURE POLYSILICON THIN FILM TRANSISTOR AND PREPARATION METHOD THEREOF

CROSS-REFERENCES TO RELATED APPLICATIONS

This application is a U.S. national phase application, pursuant to 35 U.S.C. § 371, of PCT/CN2017/098337, filed Aug. 21, 2017, designating the United States, which claims priority to Chinese Application No. 201710668038.X, filed Aug. 7, 2017. The entire contents of the aforementioned patent applications are incorporated herein by this reference.

TECHNICAL FIELD

The present invention relates to a manufacturing process of a semiconductor device, and particularly, relates to a low temperature polysilicon thin film transistor and a preparation method thereof.

BACKGROUND ART

The flat display device has many advantages such as thin profile, electricity economization, no radiation and so on, and has been widely used. The existing flat display device mainly includes a liquid crystal display device (LCD) and an organic light emitting display (OLED). The thin film transistors (TFTs) are important components of flat display devices, may be formed on glass substrates or plastic substrates, and typically used as switching devices and driving devices of LCDs and OLEDs, for example.

In recent years, the display technology has been rapidly developed, and the thin film transistor technology has developed from the original amorphous silicon (a-Si) thin film transistor to the low temperature polysilicon (LTPS) thin film transistor. The LTPS thin film transistors have many advantages, and for example, the LTPS thin film transistors have a higher electron mobility, which not only can effectively reduce the area of thin film transistors and improve the aperture rate, but also can reduce overall power consumption while improving the display brightness. For another example, the higher electron mobility may allow a part of the drive circuit to be integrated on the substrate, reduce a number of the drive integrated circuit IC, greatly enhance the reliability of the display panel, and significantly reduce manufacturing cost. Therefore, LTPS thin film transistor has gradually become a research hot topic in display field.

The structure of the existing LTPS thin film transistors mainly includes a base substrate and a polysilicon active layer, a gate insulating layer, a gate electrode, a source electrode and a drain electrode successively provided on the base substrate, and the source electrode and the drain electrode are electrically connected to the polysilicon active layer through a via hole. The gate insulating layer covering the polysilicon active layer is formed by a deposition process, and a defect density of the gate insulating layer is relatively large and thus carriers in the polysilicon active layer are easy to diffuse into the gate insulating layer resulting a formation of larger leakage current and an increase in the instability of the electric performance of LTPS thin film transistors. Therefore, the prior art still needs to be improved and developed.

SUMMARY

In view of the above, the present invention provides a low temperature polysilicon thin film transistor and a preparation method thereof, which can reduce the defect density of the connection interface between a polysilicon active layer and a gate insulating layer and reduce the leakage current of a thin film transistor such that the thin film transistor has a good and stable electric performance.

In order to achieve the purpose described above, the present invention adopts the following technical solutions:

A preparation method of a low temperature polysilicon thin film transistor comprises: successively forming a polysilicon active layer and a gate insulating layer covering the active layer on a base substrate; implanting nitrogen ions on a surface of the polysilicon active layer facing the gate insulating layer by an ion implantation process to form an ion implantation layer; and recrystallizing the ion implantation layer by a high temperature annealing process to form a silicon nitride spacing layer between the polysilicon active layer and the gate insulating layer.

The preparation method includes:

S1, forming a polysilicon thin film layer on the base substrate;

S21, implanting the nitrogen ions on the surface of the polysilicon film layer by the ion implantation process to form the ion implantation layer;

S31, etching the polysilicon thin film layer to form a patterned polysilicon active layer, and the ion implantation layer being remained on the surface of the polysilicon active layer;

S41, depositing the gate insulating layer covering the polysilicon active layer on the base substrate;

S5, successively forming a gate electrode and an interlayer dielectric layer on the gate insulating layer;

S6, forming the silicon nitride spacing layer between the polysilicon active layer and the gate insulating layer by recrystallizing the ion implantation layer through the high temperature annealing process;

S7, forming a first via hole and a second via hole which expose the polysilicon active layer by etching the interlayer dielectric layer and the gate insulating layer; and S8, forming a patterned source electrode and a drain electrode on the interlayer dielectric layer, the source electrode being connected to the polysilicon active layer through the first via hole, the drain electrode being connected to the polysilicon active layer through the second via hole.

The preparation method includes:

S1, forming a polysilicon thin film layer on a base substrate;

S22, forming a patterned polysilicon active layer by etching the polysilicon film layer;

S32, depositing a gate insulating layer covering the polysilicon active layer on the base substrate;

S42, implanting nitrogen ions from above the gate insulating layer by an ion implantation process to form an ion implantation layer on a surface of the polysilicon active layer;

S5, successively forming a gate electrode and an interlayer dielectric layer on the gate insulating layer;

S6, forming a silicon nitride spacing layer between the polysilicon active layer and the gate insulating layer by recrystallizing the ion implantation layer using a high temperature annealing process;

S7, forming a first via hole and a second via hole which expose the polysilicon active layer by etching the interlayer dielectric layer and the gate insulating layer; and S8, forming a patterned source electrode and a drain electrode on the interlayer dielectric layer, the source electrode being connected to the polysilicon active layer through the first via hole, the drain electrode being connected to the polysilicon active layer through the second via hole.

Wherein the step S1 specifically includes: S11, successively depositing a buffer layer and an amorphous silicon thin film layer on the base substrate; and S12, forming a polysilicon thin film layer by crystalizing the amorphous silicon thin film layer through an excimer laser annealing process.

Wherein the buffer layer includes a silicon nitride layer and a silicon oxide layer successively formed on the base substrate.

Wherein before the step S1, the preparation method further includes: S0, forming a patterned shielding unit on the base substrate, and the shielding unit being directed to the patterned polysilicon active layer formed in a subsequent process.

Wherein after the formation of the patterned polysilicon active layer, the polysilicon active layer is doped by an ion implantation process so that the polysilicon active layer is formed with an undoping region, a lightly doping region and a heavily doping region from a middle portion to both ends; and wherein the source electrode is electrically connected to the heavily doping region at one end of the polysilicon active layer, and the drain electrode is electrically connected to the heavily doping region at the other end of the polysilicon active layer.

Wherein the gate insulating layer is a silicon oxide layer or a silicon nitride layer or a composite structure layer in which a silicon oxide layer and a silicon nitride layer are stacked.

The present invention also provides a low temperature polysilicon thin film transistor including a polysilicon active layer, a gate insulating layer, a gate electrode, a source electrode and a drain electrode successively provided on a base substrate, wherein a connection interface between the polysilicon active layer and the gate insulating layer is formed with a silicon nitride spacing layer, and the silicon nitride spacing layer and the polysilicon active layer are in a integrally interconnected structure.

Wherein the silicon nitride spacing layer is formed on a surface of the polysilicon active layer by an ion implantation process and a high temperature annealing process, the gate insulating layer is formed on the polysilicon active layer by a deposition process, and a defect density of the silicon nitride spacing layer is smaller than a defect density of the gate insulating layer.

The low temperature polysilicon thin film transistor and the preparation method thereof provided in embodiments of the present invention form a silicon nitride spacing layer by an ion implantation process and a high temperature annealing process at a connection interface between a polysilicon active layer and a gate insulating layer, wherein the silicon nitride spacing layer may reduce a defect density of the connection interface between the polysilicon active layer and the gate insulating layer, reduce a leakage current of the thin film transistor, and increase a breakdown voltage, such that the thin film transistor has good and stable electric performance.

DETAILED DESCRIPTION

Figure 1:
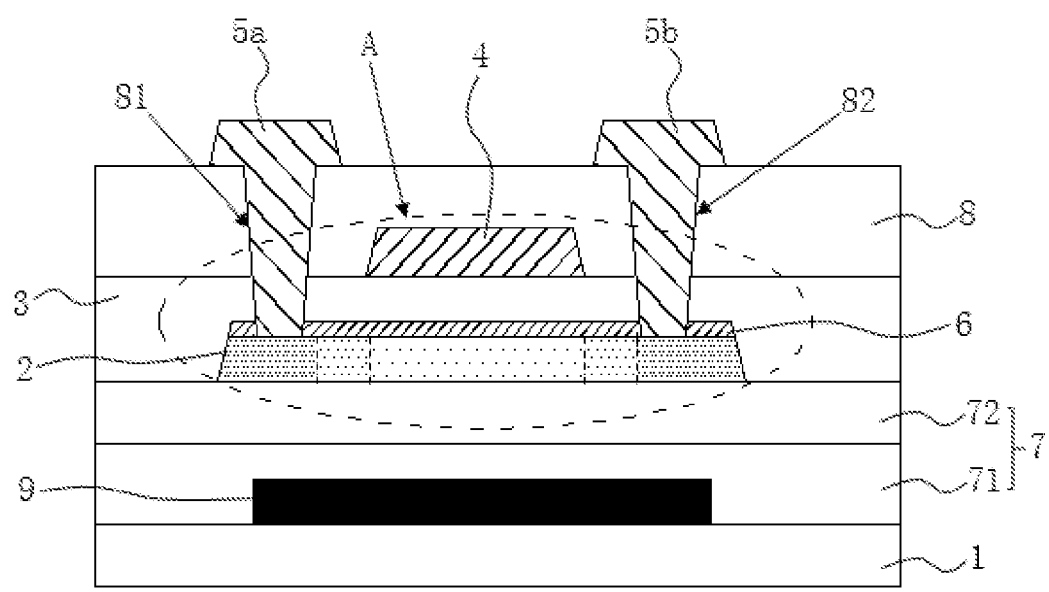
FIG. 1 is a schematic structural view of a low temperature polysilicon thin film transistor provided by Embodiment 1 of the present invention.

In order to make a purpose, technical solutions and advantages of the present disclosure to be clearer, the detailed description of the present invention will be further explained below in conjunction with the attached drawings. Examples of these preferred embodiments are illustrated in the accompanying drawings. The embodiments of the invention shown in the drawings and described in accordance with the accompanying drawings are merely exemplary, and the invention is not limited to these embodiments.

Herein, it should also be noted that, in order to avoid obscuring the present invention due to unnecessary details, only structural and/or processing steps closely related to the solution according to the invention are shown in the accompanying drawings, and other details less relevant to the present invention are omitted.

Embodiment 1

The present embodiment provides a low temperature polysilicon thin film transistor, and as shown in FIG. 1, the low temperature polysilicon thin film transistor includes a polysilicon active layer 2, a gate insulating layer 3, a gate electrode 4, a source electrode 5a and a drain electrode 5b successively provided on a base substrate 1. Wherein a connection interface between the polysilicon active layer 2 and the gate insulating layer 3 is formed with a silicon nitride spacing layer 6, and the silicon nitride spacing layer 6 is in an integrally interconnected structure with the polysilicon active layer 2.

Figure 2:
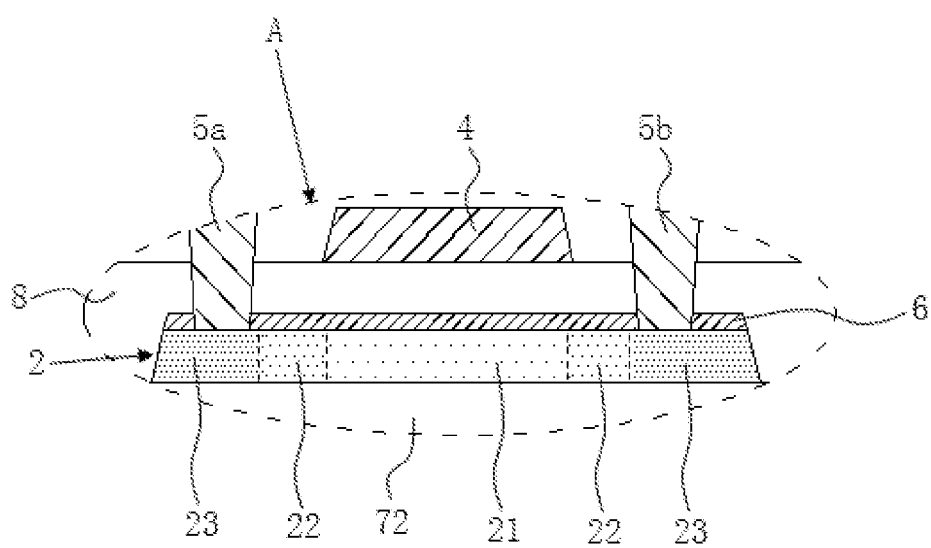
FIG. 2 is an enlarged schematic view of part A in FIG. 1.

Specifically, as shown in FIGS. 1 and 2, a buffer layer 7 including a silicon nitride layer 71 and a silicon oxide layer 72 successively formed on the base substrate is firstly provided on the base substrate 1. The polysilicon active layer 2 is formed on the buffer layer 7. The silicon nitride spacing layer 6 is formed on a surface of the polysilicon active layer 2 by an ion implantation process and a high temperature annealing process. The gate insulating layer 3 is formed on the buffer layer 7 by a deposition process and covers the polysilicon active layer 2 and the silicon nitride spacing layer 6 formed on the connection interface between the polysilicon active layer 2 and the gate insulating layer 3. The gate electrode 4 is formed on the gate insulating layer 3 and is relatively positioned right above the polysilicon active layer 2, and the gate electrode 4 is covered with an interlayer dielectric layer 8. The source electrode 5a and the drain electrode 5b are formed on the interlayer dielectric layer 8, the source electrode 5a is electrically connected to one end of the polysilicon active layer 2 through a first via hole 81 provided in the interlayer dielectric layer 8 and the gate insulating layer 3, and the drain electrode 5b is electrically connected to the other end of the polysilicon active layer 2 through a second via hole 82 provided in the interlayer dielectric layer 8 and the gate insulating layer 3.

Further, as shown in FIG. 1, a patterned light shielding unit 9 is provided between the base substrate 1 and the buffer layer 7, and the light shielding unit 9 is directed to the patterned polysilicon active layer 2 above.

Further, as shown in FIG. 2, the polysilicon active layer 2 is subjected to a doping process in sub-regions, and the polysilicon active layer 2 is successively formed with an undoping region 21, a lightly drain doping (LDD) region 22 and a heavily drain doping (HDD) region 23 from a middle portion to both ends. The source electrode 5a electrically connected to the heavily drain doping region 23 at one end of the polysilicon active layer 2 by penetrating the silicon nitride spacing layer 6, and the drain electrode 2b is electrically connected to the heavily drain doping region 23 at the other end of the polysilicon active layer 2 by penetrating the silicon nitride spacing layer 6.

As illustrated in the low temperature polysilicon thin film transistor provided by the above embodiment, the silicon nitride spacing layer is formed at the connection interface between the polysilicon active layer and the gate insulating layer, is formed on the surface of the polysilicon active layer by the ion implantation process and the high temperature annealing process, and is in an integrally interconnected structure with the polysilicon active layer, and its defect density is much smaller than a defect density of the gate insulating layer. The silicon nitride spacing layer reduces the defect density of the connection interface between the polysilicon active layer and the gate insulating layer, reduces a leakage current of the thin film transistor, increases a breakdown voltage, and makes the thin film transistor have good and stable electric performance.

Embodiment 2

Figure 3A:
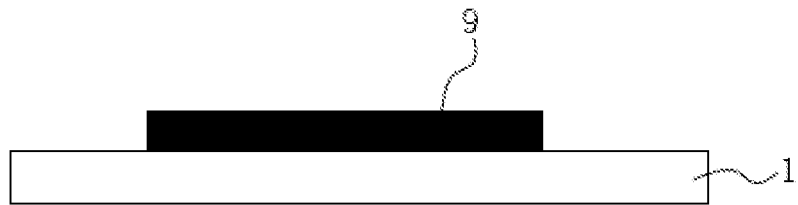
FIGS. 3A to 3K are exemplary view of the device structures correspondingly obtained from the respective steps in the preparation method of the low temperature polysilicon thin film transistor provided by Embodiment 2 of the present invention.

The present embodiment provides a preparation method of a low temperature polysilicon thin film transistor, referring to FIGS. 3A to 3k, the preparation method includes:

S0, as shown in FIG. 3A, a base substrate 1 is provided, a patterned light shielding unit 9 is formed on the base substrate 1. Specifically, the base substrate 1 may be a glass substrate, and the patterned light shielding unit 9 may be formed by a deposition process and a photolithography process performed successively.

Figure 3B:
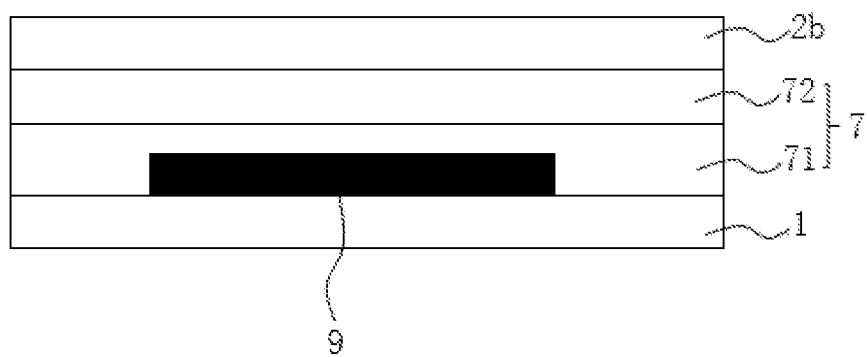

S1, a polysilicon thin film layer 2a is formed on the base substrate 1. This step specifically includes:

Wherein, the step S1 specifically includes:

S11, as shown in FIG. 3B, a buffer layer 7 and a amorphous silicon thin film layer 2b are successively deposited on the base substrate 1 by a semiconductor deposition process, the buffer layer 7 includes a silicon nitride layer 71 and a silicon oxide layer 72 successively formed on the base substrate 1, and the buffer layer 7 covers the light shielding unit 9.

Figure 3C:
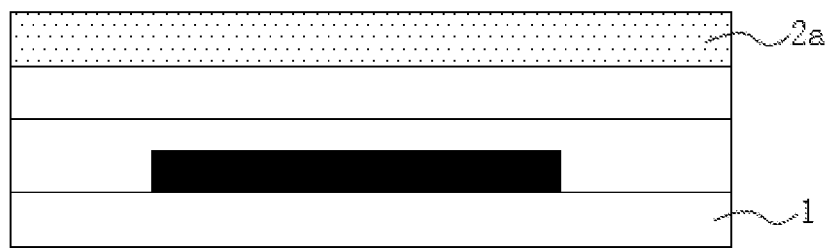

S12, as shown in FIG. 3C, a polysilicon thin film layer 2a is formed by crystallizing the amorphous silicon thin film layer 2b using an excimer laser annealing (ELA) process.

In the preferred embodiment, the amorphous silicon thin film layer 2b is subjected to a heating dehydrogenation treatment before carrying out the ELA process in step S12, whereby the finally prepared polysilicon film layer 2a has better electric performance. Specifically, the temperature of the heating dehydrogenation treatment may be selected to be 350 to 450° C.

Figure 3D:
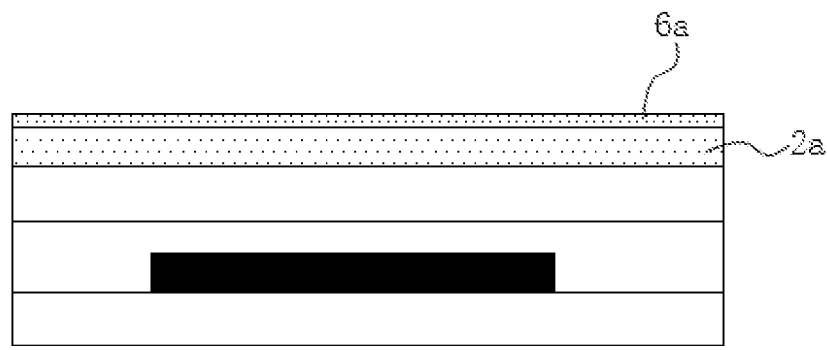

S21, as shown in FIG. 3D, the ion implantation layer 6a is formed by implanting nitrogen ions on a surface of the polysilicon film layer 2a by an ion implantation process.

Figure 3E:
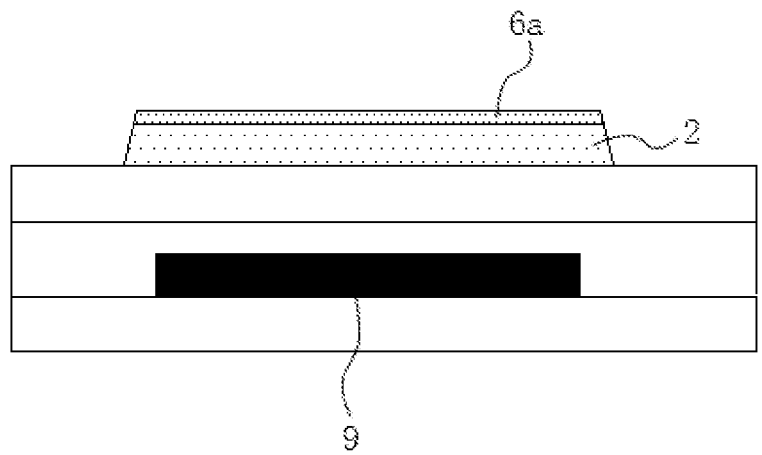

S31, as shown in FIG. 3E, the polysilicon thin film layer 2a is etched to form a patterned polysilicon active layer 2 by a photolithography process, and the ion implantation layer 6a is remained on the surface of the polysilicon active layer 2. The patterned polysilicon active layer 2 is directed to the patterned light shielding unit 9 below.

Figure 3F:
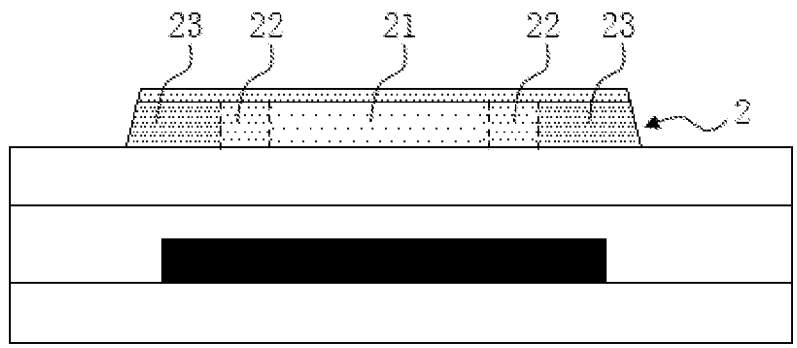

Further, as shown in FIG. 3F, the polysilicon active layer 2 is doped by the ion implantation process, and is successively formed with an undoping region 21, a lightly drain doping (LDD) region 22, and a heavily drain doping (HDD) region 23 from the middle portion to the both ends. In particular, the polysilicon active layer 2 may be ion implanted twice by using a half-tone mask process or a gray-tone mask process to form the undoping region 21, the lightly drain doping region 22 and heavily drain doping regions 23.

Figure 3G:
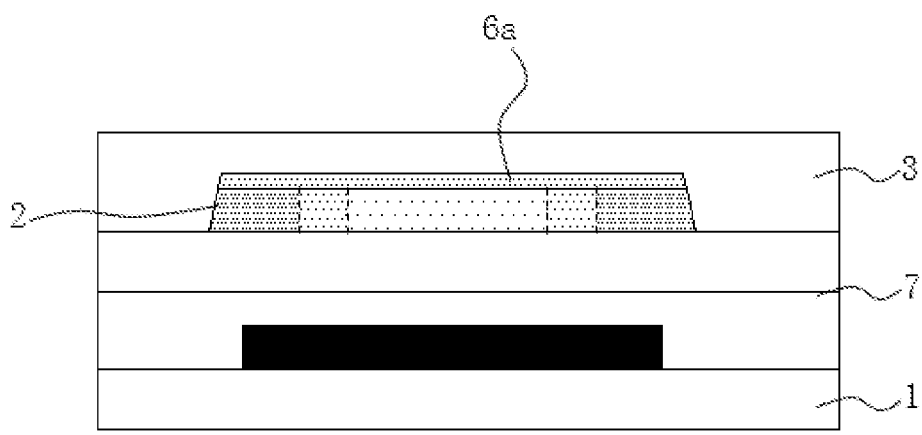

S41, as shown in FIG. 3G, a gate insulating layer 3 covering the polysilicon active layer 2 is deposited on the base substrate 1. Specifically, the gate insulating layer 3 is formed on the buffer layer 7 and covers the polysilicon active layer 2 and the ion implantation layer 6a, and the gate insulating layer 3 may be a silicon oxide ($SiO_x$) layer or a silicon nitride ($SiN_x$) layer or a composite structure layer in which a silicon oxide layer and a silicon nitride layer are stacked.

Figure 3H:
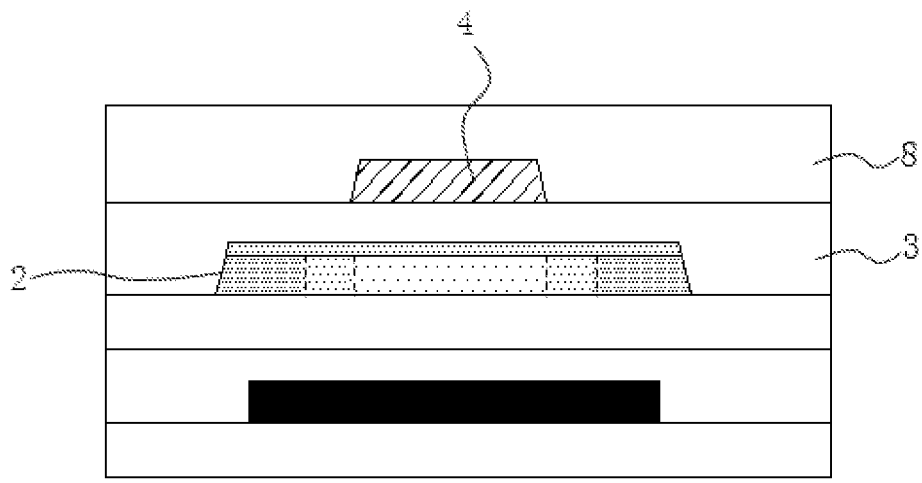

S5, as shown in FIG. 3H, a gate electrode 4 and a interlayer dielectric layer 8 are successively formed on the gate insulating layer 3. Specifically, the patterned gate electrode 4 is formed successively by the deposition process and the photolithography process, the gate electrode 4 is positioned relatively right above the polysilicon active layer 2, and the material of the gate electrode 4 is selected from but is not limited to one or more of Cr, Mo, Al, and Cu, and the gate electrode 4 may be a single layer or a stack of multi-layers. The interlayer dielectric layer 8 is then formed by the deposition process, covers the gate electrode 4, and may be a silicon oxide ($SiO_x$) layer or a silicon nitride ($SiN_x$) layer or a composite structure layer in which a silicon oxide layer and a silicon nitride layer are stacked.

Figure 3I:
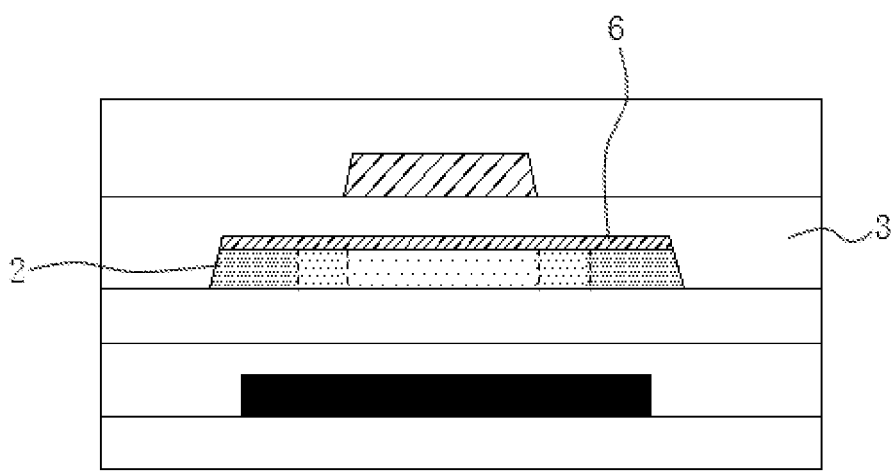

S6, as shown in FIG. 3I, the device structure prepared by steps described above is annealed by a high temperature annealing process, such that the ion implantation layer 6a is recrystallized, and a silicon nitride spacing layer 6 is then formed between the polysilicon active layer 2 and the gate insulating layer 3. Most of nitrogen ions implanted into silicon are embedded in the lattice damage region formed by the implantation, and at the high temperature annealing, the damage region starts to grow and recrystallize, so as to form a continuous solid solution S1-N band which stacks at the interface of the polysilicon active layer 2 and the gate insulating layer 3 to form a silicon nitride spacing layer and generate silicon surface oxidation suppressing effect. In addition, the implantation of nitrogen ions can effectively suppress a TED (Transient enhanced diffusion) problem in the heat treatment, control the channel length of the polysilicon active layer 2 and improve the leakage problem of p-n junction. The TED is formed in that the supersaturating self interstitial silicon atoms and the substitutional dopant atoms bond to form a interstitial state, and then move in the high temperature heat treatment. After the nitrogen ions are implanted, the nitrogen ions are more likely to form movable atoms with self interstitial atoms compared to the dopant atoms, thereby suppressing the TED, that is, suppressing the diffusion of the dopant atoms into the gate insulating layer 3.

Figure 3J:
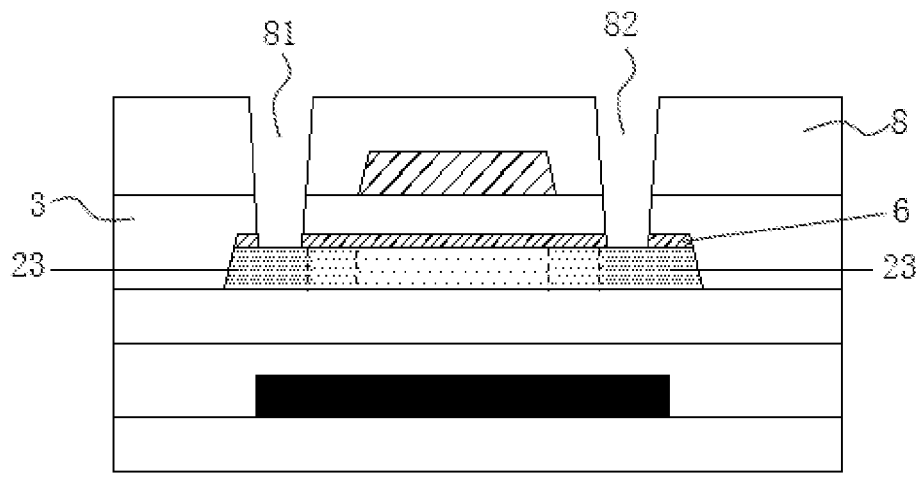

S7, as shown in FIG. 3J, a first via hole 81 and a second via hole 82 are formed by etching the interlayer dielectric layer 8 and the gate insulating layer 3 by a photolithography process, the first via hole 81 and the second via hole 82 penetrate the silicon nitride spacing layer 6 until the polysilicon active layer 2 is exposed. The first via hole 81 and the second via hole 82 communicate with the heavily drain doping regions 23 at the both ends of the polysilicon active layer 2, respectively.

Figure 3K:
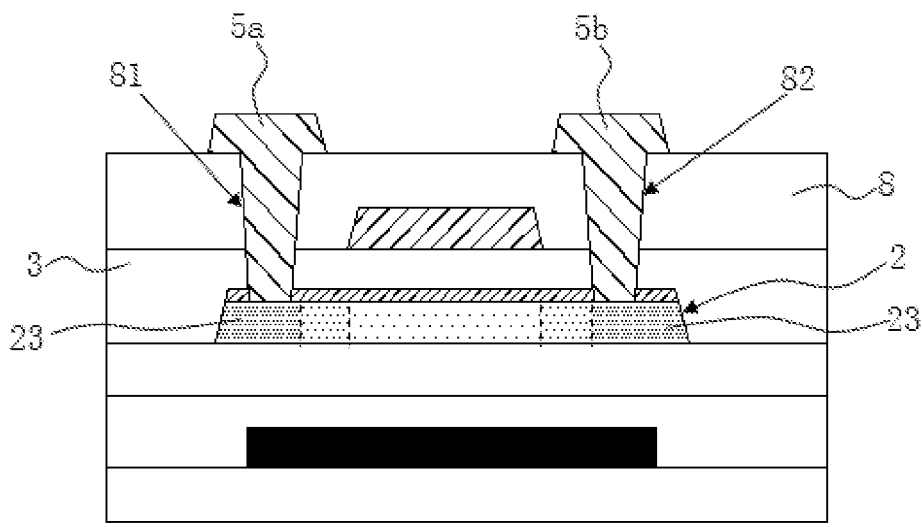

S8, as shown in FIG. 3K, a patterned source electrode 5a and a patterned drain electrode 5b are formed on the interlayer dielectric layer 8, the source electrode 5a is connected to the polysilicon active layer 2 through the first via hole 81, and the drain electrode 5b is connected to the polysilicon active layer 2 through the second via hole 82. Specifically, the patterned source and drain electrodes 5a and 5b are formed successively by the deposition process and the photolithography process, the source electrode 5a is electrically connected to the heavily drain doping region 23 at one end of the polysilicon active layer 2, and the drain electrode 5b is electrically connected to the heavily drain doping region 23 at the other end of the polysilicon active layer 2, and the materials of the source and drain electrodes 5a and 5b which may be a single layer or a stack of multi-layers are selected from but is not limited to one or more of Cr, Mo, Al, and Cu.

In the above processes, the lithography (patterning) process is used in multiple steps. Among these, each photolithography process includes mask, exposure, development, etching, stripping processes and so on, wherein the etching process includes a dry etching and a wet etching. The lithographic process is already a more mature process in the art and will not be described in detail here.

Embodiment 3

The present embodiment provides a preparation method of a low temperature polysilicon thin film transistor, and the preparation method of the present embodiment is different in the order of some steps as compared with the preparation method provided by Embodiment 2.

Referring to the steps S0 and S1 in Embodiment 2, a polysilicon thin film layer 2a having a structure as shown in FIG. 3C is formed on the base substrate 1. After the preparation of the polysilicon thin film layer 2a, the following steps are different from that in Embodiment 2.

Figure 4A:
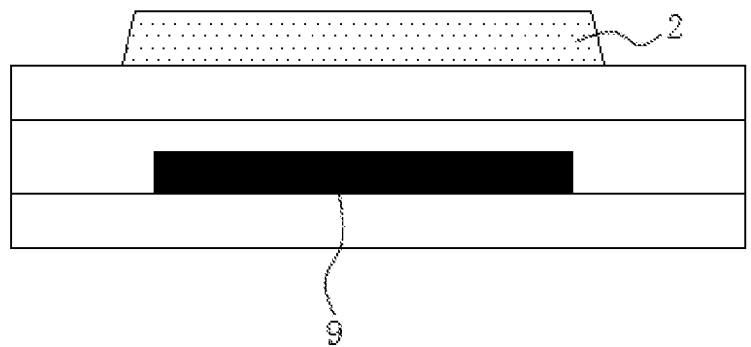
FIGS. 4A to 4F are exemplary view of the device structures correspondingly obtained from the respective steps in the preparation method of the low temperature polysilicon thin film transistor provided by Embodiment 3 of the present invention.

S22, as shown in FIG. 4A, the polysilicon thin film layer 2a is etched to form a patterned polysilicon active layer 2 by a photolithography process. The patterned polysilicon active layer 2 is directed to the patterned light shielding unit 9 below.

Figure 4B:
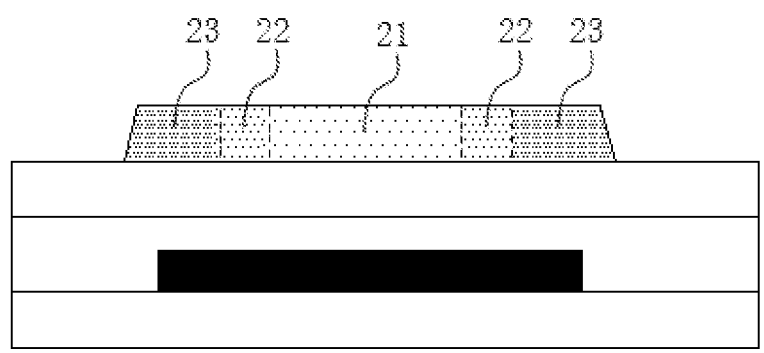

Further, as shown in FIG. 4B, the polysilicon active layer 2 is doped by an ion implantation process, and is successively formed with an undoping region 21, a lightly drain doping (LDD) region 22, and a heavily drain doping (HDD) region from a middle portion to both ends thereof. In particular, the polysilicon active layer 2 may be ion implanted twice by using a half-tone mask process or a gray-tone mask process, thereby forming the undoping region 21, the lightly drain doping region 22 and heavily drain doping regions 23.

Figure 4C:
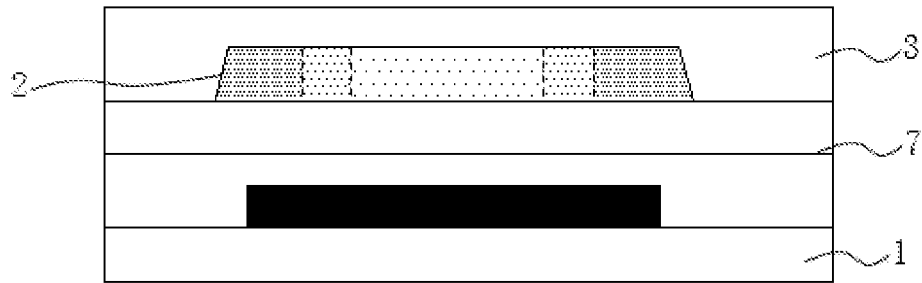

S32, as shown in FIG. 4C, a gate insulating layer 3 covering the polysilicon active layer 2 is deposited on the base substrate 1. Specifically, the gate insulating layer 3 is formed on the buffer layer 7 and covers the polysilicon active layer 2, and the gate insulating layer 3 may be a silicon oxide ($SiO_x$) layer or a silicon nitride ($SiN_x$) layer or a composite structure layer in which a silicon oxide layer and a silicon nitride layer are stacked.

Figure 4D:
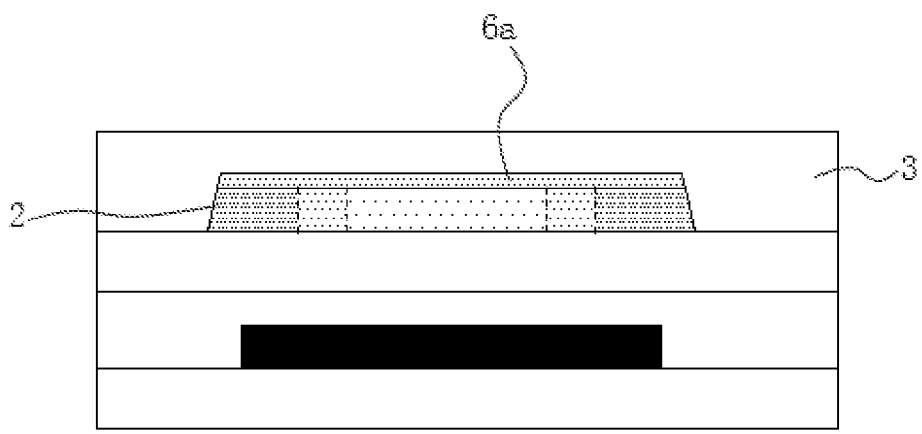

S42, as shown in FIG. 4D, nitrogen ions are implanted from above the gate insulating layer 3 by the ion implantation process, and the ion implantation layer 6a is formed on the surface of the polysilicon active layer 2.

Figure 4E:
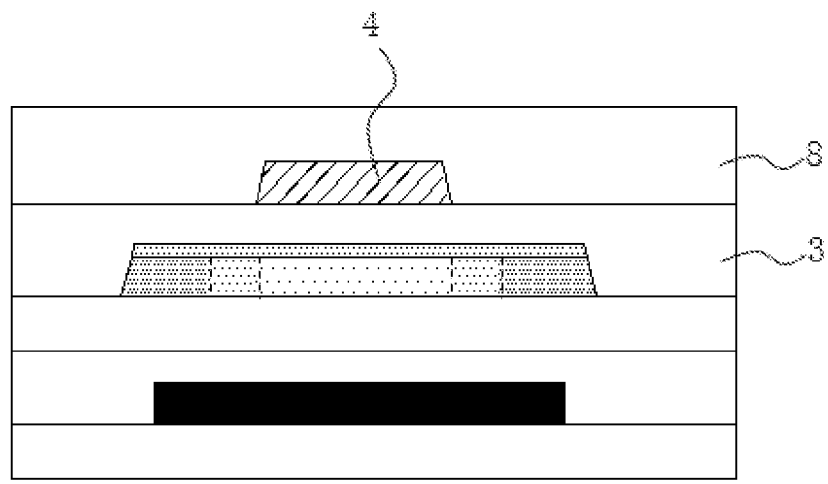

S5, as shown in FIG. 4E, a gate electrode 4 and a interlayer dielectric layer 8 are successively formed on the gate insulating layer 3. This step is carried out with reference to the step S5 in Embodiment 2.

Figure 4F:
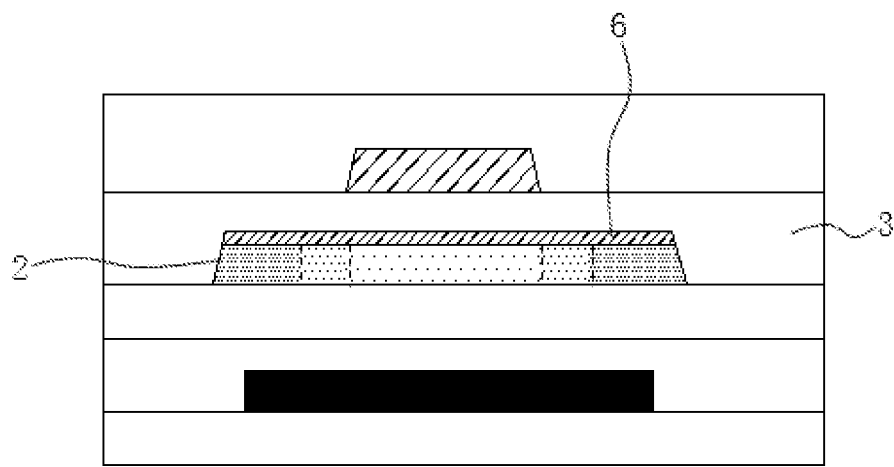

S6, as shown in FIG. 4F, the device structure prepared by steps described above is annealed by a high temperature annealing process such that the ion implantation layer 6a is recrystallized, and thus a silicon nitride spacing layer 6 is formed between the polysilicon active layer 2 and the gate insulating layer 3. This step is carried out with reference to the step S6 in Embodiment 2.

After finishing steps described above, referring to the steps S7 and S8 in Embodiment 2, the patterned source electrode 5a and the drain electrode 5b are formed on the interlayer dielectric layer 8, wherein the source electrode 5a is connected to the heavily drain doping region 23 at one end of the polysilicon active layer 2 through the first via hole 81, and the drain electrode 5b is connected to the heavily drain doping region 23 at the other end of the polysilicon active layer 2, and the finally prepared low temperature polysilicon thin film transistor is shown in FIG. 3K.

In summary, embodiments of the present invention provide a low temperature polysilicon thin film transistor and a preparation method thereof, including forming a silicon nitride spacing layer at a connection interface between a polysilicon active layer and a gate insulating layer, wherein the silicon nitride spacing layer is formed on a surface of the polysilicon active layer by an ion implantation process and a high temperature annealing process, and is in a structure integrally interconnected with the polysilicon active layer, and a defect density of the silicon nitride spacing layer is far smaller than a defect density of the gate insulating layer. The silicon nitride spacing layer reduces a defect density of the connection interface between the polysilicon active layer and the gate insulating layer, reduces a leakage current of the thin film transistor, and increases a breakdown voltage, such that the thin film transistor has good and stable electric performance and further improve the quality of the final product (for example, LCD or OLED).

It is to be noted that, in this context, relational terms such as first and second are used only to distinguish an entity or an operation from another entity or operation without necessarily requiring or implying that there is any such actual relationship or sequence between the entities or operations. Moreover, the terms "include", "including" or any other variant thereof is intended to cover a non-exclusive inclusion, such that the process, method, article, or device that includes a series of elements includes not only those elements but also other elements that are not explicitly listed, or other elements that are inherent to such processes, methods, articles, or device. The elements defined by the statement "including a . . . " do not preclude the presence of additional same elements in the process, method, article, or device that includes the elements without limitation.

The above descriptions are only detailed description of the present application, and it should be pointed out that, to those ordinary skilled in the art, several improvements and modifications can be made without departing from the principle of the present application, and also those improvements and modifications should be considered as the protection scope of the present application.

What is claimed is:

1. A preparation method of a polysilicon thin film transistor, comprising:

forming a polysilicon thin film layer on a base substrate;

implanting nitrogen ions on a surface of the polysilicon thin film layer by an ion implantation process to form an ion implantation layer;

etching the polysilicon thin film layer to form a patterned polysilicon active layer, and the ion implantation layer being remained on the surface of the polysilicon active layer;

depositing a gate insulating layer covering the polysilicon active layer on the base substrate;

successively forming a gate electrode and an interlayer dielectric layer on the gate insulating layer;

forming a silicon nitride spacing layer between the polysilicon active layer and the gate insulating layer by crystallizing the ion implantation layer through an annealing process;

forming a first via hole and a second via hole which expose the polysilicon active layer by etching the interlayer dielectric layer and the gate insulating layer; and forming a patterned source electrode and a drain electrode on the interlayer dielectric layer, the source electrode being connected to the polysilicon active layer through the first via hole, the drain electrode being connected to the polysilicon active layer through the second via hole.

2. The preparation method of claim 1, wherein forming the polysilicon thin film layer specifically includes:
successively depositing a buffer layer and an amorphous silicon thin film layer on the base substrate; and
forming the polysilicon thin film layer by crystallizing the amorphous silicon thin film layer by an excimer laser annealing process.

3. The preparation method of claim 2, wherein the buffer layer includes a silicon oxide layer and a silicon nitride layer successively formed on the base substrate.

4. The preparation method of claim 2, further comprising before forming the polysilicon thin film layer:
forming a patterned shielding unit on the base substrate, the shielding unit being directed to the patterned polysilicon active layer formed in a subsequent process.

5. The preparation method of claim 2, wherein after the formation of the patterned polysilicon active layer, the polysilicon active layer is doped by an ion implantation process so that the polysilicon active layer is formed with an undoping region, a lightly drain doping region and a heavily drain doping region from a middle portion to both ends; and wherein the source electrode is electrically connected to the heavily drain doping region at one end of the polysilicon active layer, and the drain electrode is electrically connected to the heavily drain doping region at the other end of the polysilicon active layer.

6. The preparation method of claim 1, wherein the gate insulating layer is a silicon oxide layer or a silicon nitride layer or a composite structure layer in which a silicon oxide layer and a silicon nitride layer are stacked.

7. A preparation method of a polysilicon thin film transistor, comprising:
forming a polysilicon thin film layer on a base substrate;
forming a patterned polysilicon active layer by etching the polysilicon film layer;
depositing a gate insulating layer covering the polysilicon active layer on the base substrate;
implanting nitrogen ions from above the gate insulating layer by an ion implantation process to form an ion implantation layer on a surface of the polysilicon active layer;
successively forming a gate electrode and an interlayer dielectric layer on the gate insulating layer;

forming a silicon nitride spacing layer between the polysilicon active layer and the gate insulating layer by crystallizing the ion implantation layer using an annealing process;

forming a first via hole and a second via hole which expose the polysilicon active layer by etching the interlayer dielectric layer and the gate insulating layer; and forming a patterned source electrode and a drain electrode on the interlayer dielectric layer, the source electrode being connected to the polysilicon active layer through the first via hole, the drain electrode being connected to the polysilicon active layer through the second via hole.

8. The preparation method of claim 7, wherein forming the polysilicon thin film layer specifically includes:
successively depositing a buffer layer and an amorphous silicon thin film layer on the base substrate; and
forming a polysilicon thin film layer by crystallizing the amorphous silicon thin film layer through an excimer laser annealing process.

9. The preparation method of claim 8, wherein the buffer layer includes a silicon oxide layer and a silicon nitride layer successively formed on the base substrate.

10. The preparation method of claim 8, further comprising before forming the polysilicon thin film layer:
forming a patterned shielding unit on the base substrate, the shielding unit being directed to the patterned polysilicon active layer formed in a subsequent process.

11. The preparation method of claim 8, wherein after the formation of the patterned polysilicon active layer, the polysilicon active layer is doped by an ion implantation process so that the polysilicon active layer is formed with an undoping region, a lightly drain doping region and a heavily drain doping region from a middle portion to both ends; and wherein the source electrode is electrically connected to the heavily drain doping region at one end of the polysilicon active layer, and the drain electrode is electrically connected to the heavily drain doping region at the other end of the polysilicon active layer.

12. The preparation method of claim 7, wherein the gate insulating layer is a silicon oxide layer or a silicon nitride layer or a composite structure layer in which a silicon oxide layer and a silicon nitride layer are stacked.

13. A polysilicon thin film transistor, comprising:
a base substrate;
a patterned light shielding unit disposed on the base substrate;
a buffer layer covering the patterned light shielding unit and the base substrate;
a polysilicon active layer disposed on the buffer layer, wherein the polysilicon active layer is doped by an ion implantation process so that the polysilicon active layer is formed with an undoping region, a lightly drain doping region and a heavily drain doping region from a middle portion to both ends;
a gate insulating layer covering the polysilicon active layer;
a gate electrode disposed on the gate insulating layer;
a dielectric layer covering the gate electrode;
a source electrode and a drain electrode that are electrically connected to the heavily drain doping region at the both ends of the polysilicon active layer, and
a silicon nitride spacing layer interposed between the polysilicon active layer and the gate insulating layer, wherein the silicon nitride spacing layer and the polysilicon active layer are in an integrally interconnected structure.

14. The low temperature polysilicon thin film transistor of claim 13, wherein the silicon nitride spacing layer is formed on a surface of the polysilicon active layer by an ion implantation process and an annealing process, and
wherein the gate insulating layer is formed on the polysilicon active layer by a deposition process, and a defect density of the silicon nitride spacing layer is smaller than a defect density of the gate insulating layer due to the ion implantation process and the annealing process.

* * * * *